US006320444B1

United States Patent
Shenoy et al.

(10) Patent No.: US 6,320,444 B1
(45) Date of Patent: Nov. 20, 2001

(54) INITIAL PHASE CONTROL OF AN OSCILLATOR

(75) Inventors: Ravindra U. Shenoy, Sunnyvale; Tzu-wang Pan, San Jose, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/354,644

(22) Filed: Jul. 15, 1999

(51) Int. Cl.[7] .................................................. H03H 11/26
(52) U.S. Cl. ............................ 327/280; 327/276; 327/278
(58) Field of Search ..................................... 327/261, 270, 327/276, 272, 278, 280, 281, 287, 266, 274

(56) References Cited

U.S. PATENT DOCUMENTS

| | | | | |
|---|---|---|---|---|
| 4,795,923 | * | 1/1989 | Dobos | 327/280 |
| 4,866,314 | * | 9/1989 | Traa | 327/278 |
| 5,121,014 | * | 6/1992 | Huang | 327/276 |
| 5,521,539 | * | 5/1996 | Molin | 327/274 |
| 5,596,610 | * | 1/1997 | Leung et al. | 327/288 |
| 5,731,727 | * | 3/1998 | Iwamoto et al. | 327/276 |
| 5,757,873 | * | 5/1998 | Hunt | 327/65 |
| 6,005,445 | * | 12/1999 | Katakura | 331/34 |

OTHER PUBLICATIONS

Cideciyan, Roy D.; Dolivo, Francois; Hermann, Reto; Hirt, Walter, "A PRML System for Digital Magnetic Recording", Jan. 1, 1992, IEEE Journal on Selected Areas in Communications.

* cited by examiner

Primary Examiner—Timothy P. Callahan
Assistant Examiner—An T. Luu

(57) ABSTRACT

An initial phase control for an oscillator such as a differential ring voltage-controlled oscillator is disclosed. The initial phase control generally comprises a current source circuit coupled to a first node of the delay cell and a current provider. The current source circuit and current provider are preferably selectively and synchronously in an on or off state such that when the current source circuit and current provider are in an on state, the current source circuit draws a current through the first node of the delay cell and the current provider provides current through a second node of the delay cell. A method for controlling a delay cell and an initial phase control for a differential ring oscillator having a plurality of delay cells in a ring configuration are also disclosed.

12 Claims, 3 Drawing Sheets

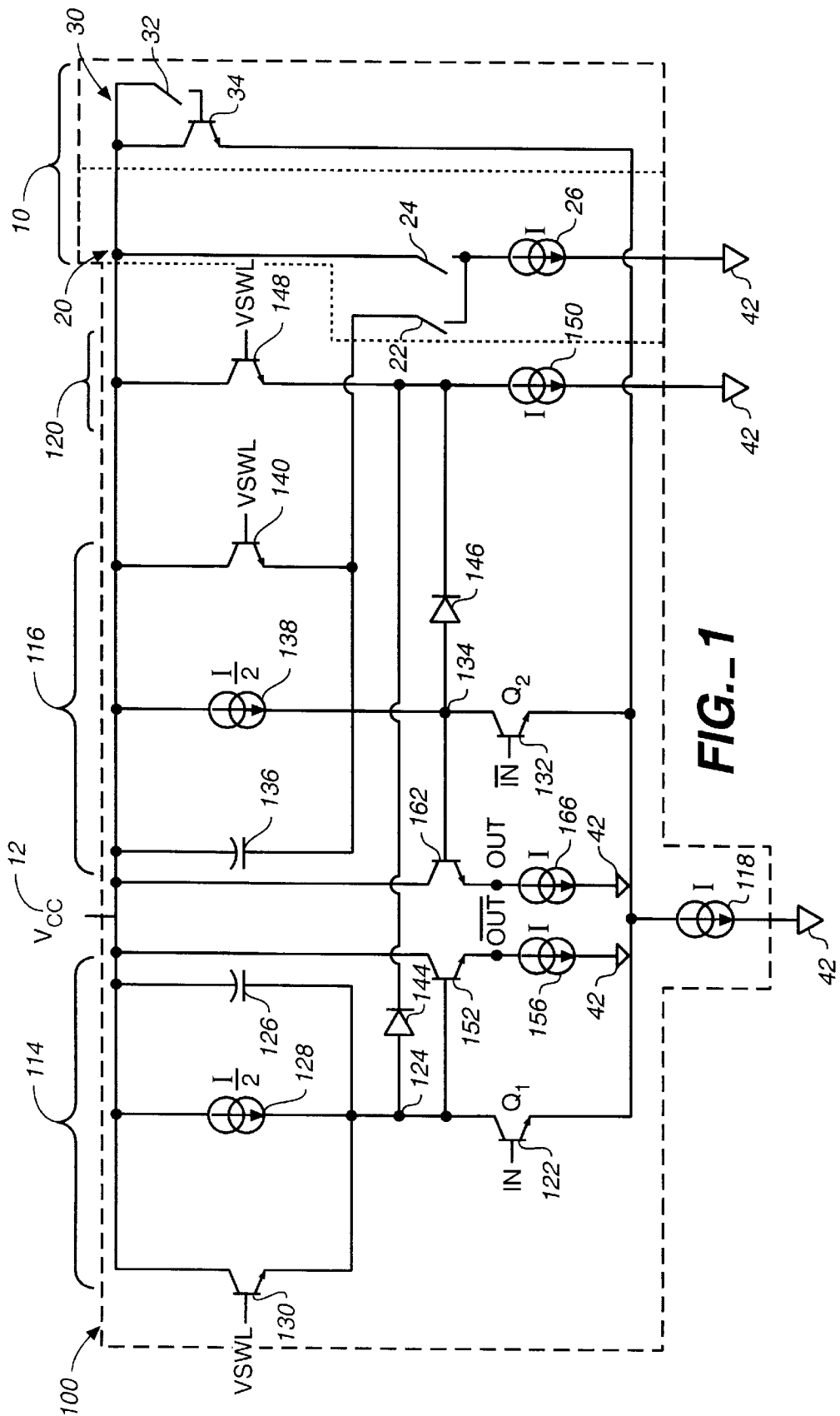
FIG._1

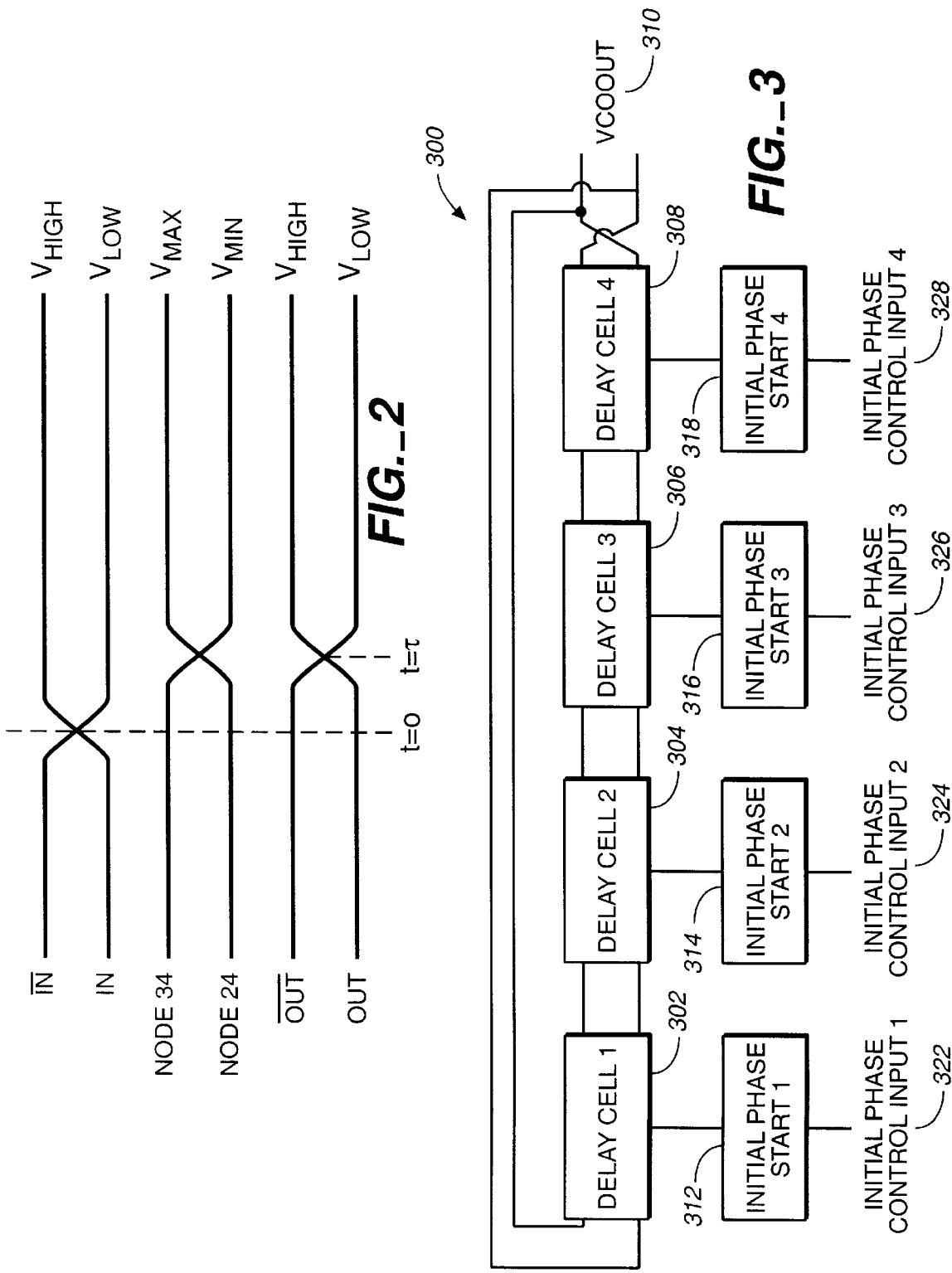

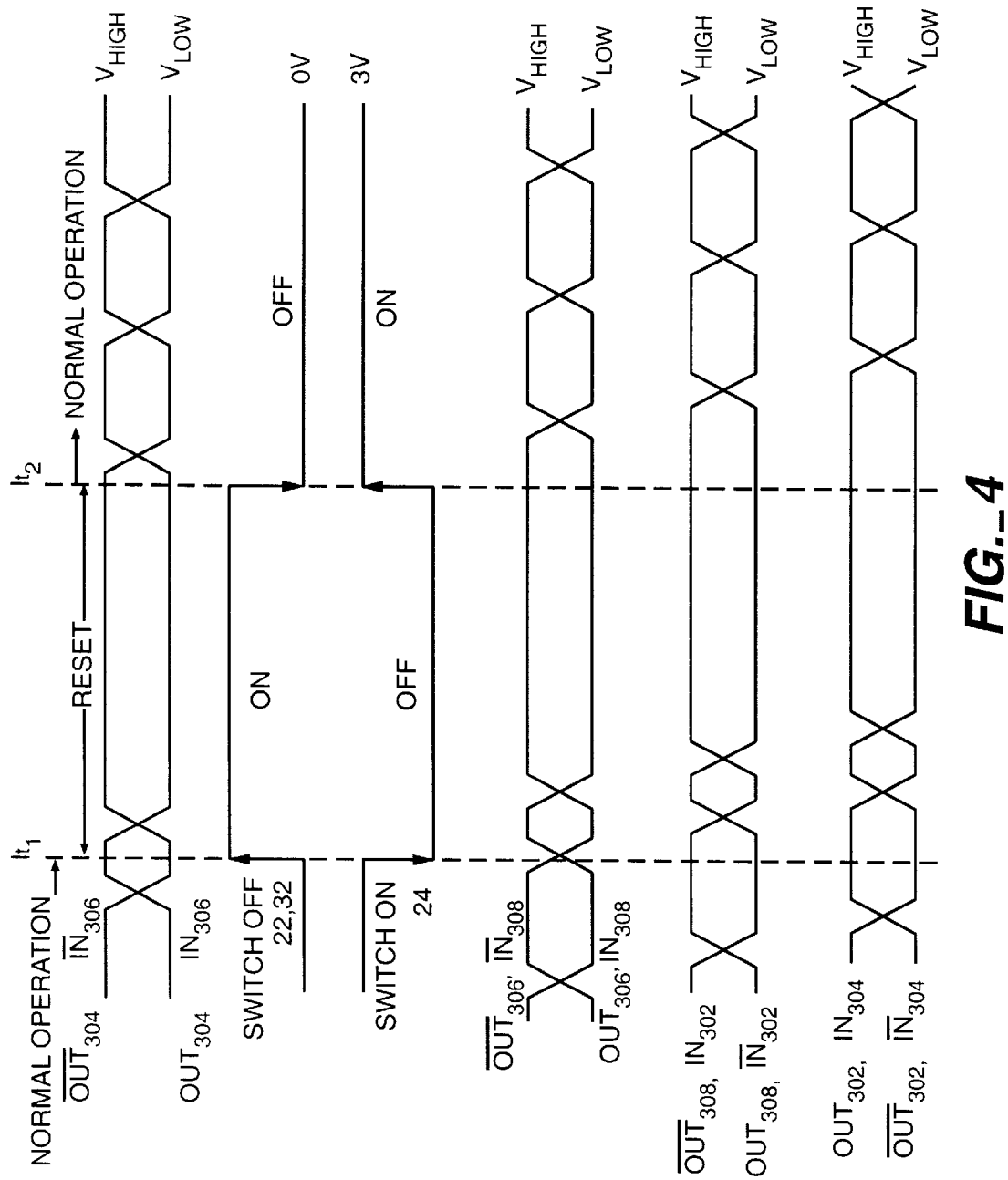
FIG._4

INITIAL PHASE CONTROL OF AN OSCILLATOR

BACKGROUND OF THE INVENTION

1. Field of the Invention

The present invention relates generally to an oscillator. More specifically, an initial phase control of an oscillator with low disturbance to high speed signal path is disclosed.

2. Description of Related Art

A phase-locked loop (PLL) generally comprises a phase detector, a low-pass filter, and a voltage-controlled oscillator (VCO). The VCO is an oscillator that produces a periodic wave form as an output signal, the frequency of which may be varied about some free-running frequency depending upon the value of the applied voltage. The free-running frequency is the frequency of the oscillator signal or the VCO output when the applied voltage is 0.

The phase detector receives an incoming signal and the output signal of the VCO and produces a phase detector output signal. The phase detector output signal represents the phase difference between the incoming and oscillator signals. The phase detector output signal is filtered through the low pass filter. The output of the low pass filter is the output of the PLL and the applied voltage to the VCO used to change the frequency of the VCO output. The closed-loop operation of the circuit maintains the VCO frequency locked to that of the incoming signal frequency.

If the applied signal of the VCO has the free-running frequency as an initial frequency, the PLL will acquire lock and the VCO will track the incoming signal frequency over some range, provided that the incoming signal frequency changes slowly. However, the loop will remain locked only over some finite range of frequency shift.

When the loop is operating in lock, the incoming signal and the VCO output signal fed to the phase comparator are of the same frequency. When the loop is trying to achieve lock, the output of the phase comparator contains frequency components at the sum and difference of the signals compared. The low-pass filter passes only the lower frequency component of the signals so that loop can obtain lock between incoming and VCO signals.

During lock, the output of the low-pass filter is the value needed to hold the VCO in lock with the incoming signal. The VCO then outputs a fixed amplitude wave signal at the frequency of the incoming signal. A fixed phase difference between the incoming and the VCO output signals to the phase comparator results in a fixed applied voltage to the VCO. Changes in the incoming signal frequency then results in change in the applied voltage to the VCO.

The limited operating range of the VCO and the feedback connection of the PLL circuit results in two frequency bands specified for a PLL: a capture range and a lock range. The capture range of the PLL is the frequency range centered about the VCO free-running frequency over which the loop can acquire lock with the input signal. The lock range of the PLL is generally wider than the capture range and is the range over which the PLL can maintain lock with the incoming signal once the PLL achieves capture. Within the capture-and-lock frequency ranges, the applied voltage drives the VCO frequency to match that of the incoming signal.

A PLL can be used in a wide variety of applications, including (1) modems, telemetry receivers and transmitters, tone decoders, AM detectors, and tracking filters; (2) demodulation of two data transmission or carrier frequencies in digital-data transmission used in frequency-shift keying (FSK) operation; (3) frequency synthesizers that provide multiples of a reference signal frequency (e.g. the carrier for the multiple channels of the citizen's band (CB) unit or marine-radio-band unit can be generated using a single-crystal-controlled frequency and its multiples generated using a PLL); and (4) FM demodulation networks for FM operation with excellent linearity between the input signal frequency and the PLL output voltage.

One example of a VCO implementation is a multiple-stage differential ring oscillator constructed using identical delay stages. Because each of the multiple stages are identical in construction, the delay of each stage is assumed to be the same. In such a differential ring design, the frequency of the VCO output signal is 1/(2×number of stages×the delay of each stage). Thus, the frequency of the VCO output signal is 1/(8×the delay of each stage) for a four-stage differential ring oscillator.

The performance of the PLL is dependent in part upon the time required for the VCO to acquire lock. The acquisition time is in turn dependent upon the phase difference between the incoming and VCO output signals. Reducing the range of the initial phase error uncertainty in the VCO output signal thus reduces the acquisition time.

The performance of the PLL is also dependent in part upon the proximity of the operating parameters of the VCO initially, such as upon start or restart, relative to the operating parameters of the VCO during operation. If the differences between the operating parameters at restart and during operation are large, the time required for the VCO to acquire lock is increased.

What is needed is a system and method to reduce or minimize the time required for the VCO to acquire lock. Ideally, the system and method introduces little or no disturbance to the high speed signal path of the delay cell. Preferably, the system and method provides or maintains values of VCO operating parameters at or close to those during operation.

SUMMARY OF THE INVENTION

An initial phase control for an oscillator is disclosed that provides control of an initial phase of the oscillator such as VCO. An initial phase start control circuit is coupled to each delay cell of a multiple delay cell oscillator such as a multiple-stage differential ring oscillator. The initial phase start control circuit is such that little or no disturbance is introduced to the high speed signal path of the delay cell. Preferably, each initial phase control circuit provides or maintains values of the VCO operating parameters at or close to those during operation. With the initial phase start, the VCO clock can be stopped asynchronously at any time.

The initial phase control for a delay cell may generally comprise a current source circuit coupled to a first node of the delay cell and a current provider. The current source circuit and current provider are preferably selectively and synchronously in an on or off state such that when the current source circuit and current provider are in an on state, the current source circuit draws a current through the first node of the delay cell and the current provider provides current through a second node of the delay cell.

In another embodiment, a method for controlling a delay cell generally includes inputting a set input to a current source circuit and inputting a reset input to the current source circuit and a current provider. The set and reset input selectively and synchronously transition the current source circuit and the current provider between an on and off state such that when the current source circuit and current provider are in an on state, the current source circuit draws a current through a first node of the delay cell and the current provider provides current through a second node to the delay cell.

An initial phase control for a differential ring oscillator may have a plurality of delay cells in a ring configuration. The initial phase control comprises at least one initial phase control circuit, each initial phase control circuit is coupled to one of the delay cells of the oscillator. Each initial phase control circuit comprises a current source circuit coupled to a first node of the delay cell to which the control circuit is coupled and a current provider. The current source circuit and current provider are selectively and synchronously in an on or off state such that when the current source circuit and current provider are in an on state, the current source circuit draws a current through the first node of the delay cell to which the control circuit is coupled and the current provider provides current through a second node of the delay cell to which the control circuit is coupled.

A differential ring oscillator with initial phase control and having a plurality of delay cells in a ring configuration generally comprises a plurality of delay cells including a first delay cell, one or more intermediate delay cells, and a last delay cell, and at least one initial phase control circuit. Each delay cell adapted to receive a first input and a second input and each delay cell having a first output node and a second output node. The delay cells may be configured in a sequential ring configuration such that the first and second output nodes of the last delay cell are coupled to the second and first inputs of the first delay cell, respectively, and the first and second output nodes of each of the first and intermediate delay cells are coupled to the first and second inputs of a subsequent delay cell comprising the intermediate and the last delay cells, respectively. Each initial phase control circuit is coupled to one of the delay cells. Each initial phase control circuit generally comprises a current source circuit coupled to a first node of the delay cell to which the control circuit is coupled and a current provider, the current source circuit and current provider are selectively and synchronously in an on or off state such that when the current source circuit and current provider are in an on state, the current source circuit draws a current through the first node of the delay cell to which the control circuit is coupled and the current provider provides current through a second node of the delay cell to which the control circuit is coupled.

BRIEF DESCRIPTION OF THE DRAWINGS

The present invention will be readily understood by the following detailed description in conjunction with the accompanying drawings, wherein like reference numerals designate like structural elements, and in which:

FIG. 1 is a simplified circuit diagram of an initial phase control circuit along with a exemplary delay cell with which the initial phase start control circuit may be used;

FIG. 2 is a timing diagram of the operating characteristics of the initial phase start control circuit and the delay circuit;

FIG. 3 is a block diagram of a four-stage differential ring oscillator implementation of VCO; and FIG. 4 is a timing diagram of the inputs and outputs of each delay stage of the four-stage differential ring VCO of FIG. 3.

DESCRIPTION OF SPECIFIC EMBODIMENTS

A initial phase control circuit, an exemplary delay cell which the initial phase control circuit may control, and a voltage-controlled oscillator (VCO) incorporating the delay cell and initial phase control are disclosed. The following description is presented to enable any person skilled in the art to make and use the invention. Descriptions of specific applications are provided only as examples. Various modifications to the preferred embodiment will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

FIG. 1 is a circuit diagram of an initial phase control circuit 10 along with a exemplary delay cell 100 with which the initial phase control circuit 10 may be used. The initial phase control circuit 10 generally comprises a first portion or a current provider 20 and a second portion or a current source circuit 30. The first portion 20 includes a first reset switch 22, a set switch 24 and a control current source 26. The second portion 30 includes a second reset switch 32 and a transistor 34.

The first and second reset switches 22, 32 and the set switch 24 are coupled such that they are selectively switched or toggled approximately simultaneously or synchronously. The first and second reset switches 22, 32 are preferably switched or toggled such that they are in the same on/off state. Further, the set switch 24 is preferably switched or toggled such that it is in an on/off state opposite to that of the first and second reset switches 22, 32. In other words, a single reset input signal may be input to both the first and second reset switches 22, 32 and a set input signal opposite in phase to and preferably of same amplitude as the reset input signal may be input to the set switch 24.

In the first portion 20, the set switch 24 is coupled between the current source 26 and the power supply 12 supplying a supply voltage $V_{CC}$. The current source 26 is in turn coupled to ground 42. The first reset switch 22 is coupled to a node between the set switch 24 and the current source 26 and is further coupled to a node of the delay cell 100.

In the second portion 30, the transistor 34 is preferably a bipolar junction transistor that has its collector, base, and emitter nodes coupled to the power supply 12, the second reset switch 32, and a node of the delay cell 100, respectively. The second reset switch 32 is further coupled to the power supply 12 such that when the second reset switch 32 is on or closed, both collector and base nodes of the transistor 34 are coupled to the power supply 12. Thus, when the second reset switch 32 is on or closed, the transistor 34 functions as a diode to supply current to the node of the delay cell 100 to which the transistor 34 is coupled.

The initial phase control circuit 10 may be used with the exemplary delay cell 100. The delay circuit 100 is similar to the delay circuit disclosed in commonly owned co-pending U.S. Ser. No. 09/354,685 entitled "Double-Clamped Delay Stage And Voltage Controlled Oscillator" (Attorney Docket No. DATAP015) filed on Jul. 15, 1999, the entirety of which is incorporated by reference herein. The delay circuit 100 comprises a first branch 114, a second branch 116, and a tail current source 118. The tail current source 118 is coupled between ground 42 and the first and second branches 114, 116. The delay circuit 100 may further comprise a third branch 120.

The first branch 114 includes a first input receiver 122 for receiving a first input IN to control a first current on the first branch 114. The first branch 114 has a first clamped node 124. The first branch 114 further includes a first timing capacitor 126, a first current source 128, and a first lower limit clamp 130, each of which is coupled between the power supply 12 and the first clamped node 124.

The first reset switch 22 of the initial phase control circuit 10 may be coupled to one of the fist and second clamped nodes 124, 134. As shown in FIG. 1, the first reset switch 22 is coupled to the second clamped node 134. Further, the emitter node of the transistor 34 of the initial phase control circuit 10 is coupled to the emitter nodes of the first and second input receivers 122, 132.

The second branch 116 includes a second input receiver 132 for receiving a second input $\overline{IN}$ to control a second current on the second branch 116. The second branch 116 has a second clamped node 134. The second branch 116 further includes a second timing capacitor 136, a second current source 138, and a second lower limit clamp 140, each of which is coupled between the power supply 12 and the second clamped node 134.

The delay circuit 100 further comprises a first current diverter or diode 144 coupled to the first branch 114 at the first clamped node 124 for diverting current on the first branch 114 away from the first input receiver 122, and a second current diverter or diode 146 coupled to the second branch 116 at the second clamped node 134 for diverting current on the second branch 116 away from the second input receiver 132. The first and second current diverters 144, 146 are coupled to the third branch 120. The third branch 120 may comprise an upper limit clamp 148 coupled between the power supply 12 and the first and second current diverters 144, 146, and an upper clamp current source 150 coupled between ground 42 and the first and second current diverters 144, 146.

Each of the first and second branches 114, 116 of the delay circuit 100 further comprises an output emitter follower circuit shown. The output emitter follower circuit of the first branch 114 includes a first output transistor 152 coupled between the power supply 12 and a first output node 154 at which the first output $\overline{OUT}$ is taken. The first clamped node 124 is coupled to the base of the first output transistor 152. The output emitter follower circuit of the first branch 114 further includes a first output current source 156 coupled between the first output node 154 and ground 42.

Similarly, the output emitter follower circuit of the second branch 116 includes a second output transistor 162 coupled between the power supply 12 and a second output node 164 at which the first output OUT is taken. The second clamped node 134 is coupled to the base of the second output transistor 162. The output emitter follower circuit of the second branch 116 further includes a second output current source 166 coupled between the first output node 154 and ground 42.

Each of the first and second input receivers 122, 132, the first and second lower limit clamps 130, 140, the upper limit clamp 148, and the first and second output transistors 152, 162 is preferably a bipolar junction transistor (BJT). Preferably, the bipolar junction transistors for the first and second input receivers 122, 132 and the transistor 34 are of generally identical construct. Similarly, the bipolar junction transistors for the first and second lower limit clamps 130, 140 are preferably of generally identical construct. Further, the bipolar junction transistors for the first and second output transistors 152, 162 are preferably of generally identical construct.

A voltage swing low input of VSWL may be applied to each of the first and second lower limit clamps 130, 140 and a voltage swing high input of VSWU may be applied to the upper limit clamp 148. Each of the first and second lower limit clamps 130, 140 having input VSWL serves to maintain or limits the voltage at the first and second clamped nodes 124, 134 from dropping below a minimum or a lower limit threshold voltage $V_{MIN}$. The upper limit clamp 148 having input VSWU serves to maintain or limit the voltages at the first and second clamped nodes 124, 134, respectively, to a maximum or an upper limit voltage $V_{MAX}$. In other words, each of the first and second lower limit clamps 130, 140 having input VSWL serves to clamp the voltage at nodes 124, 134, respectively, to a minimum voltage $V_{MIN}$ while the upper limit clamp 148 having input VSWU serves to clamp the voltage at nodes 124, 134 to a maximum voltage $V_{MAX}$.

Each of the control, tail and upper clamp current sources 26, 118, 150 preferably has a current of amplitude I while each of the first and second current sources 128, 138 preferably has a current of amplitude I/2, i.e. one-half the current of each of the control, tail, and upper clamp current sources 26, 118, 150. The first and second current sources 128, 138 serve to charge the first and second timing capacitors 126, 136, respectively. The first and second output current sources 156, 166 preferably also has a current I.

FIG. 2 shows a timing diagram of the operating characteristics of the delay circuit 100. As shown in FIG. 2, the delay cell 100 is in normal or oscillation mode after time=0. The delay of the delay circuit 100 measured from a time when the inputs IN, $\overline{IN}$ change states to a time when the outputs OUT, $\overline{OUT}$ change states is τ. Although FIG. 2 only shows a single transition from low to high of the first input IN, and a single transition from high to low of the second input $\overline{IN}$, it is to be understood that the inputs IN, $\overline{IN}$ are preferably continually or continuously transitioning between high and low voltages for a desired period of time.

Table I summarizes the states or values of some of the operating parameters of the delay circuit 100 at times prior to t=0 and after t=τ. Table II lists the approximate operating voltages for one exemplary operating mode of the delay cell circuit 100, assuming that the base-emitter threshold voltage $V_{BE}$ of each BJT is approximately 0.75 V. Table III lists the states or approximate values of some of the operating parameters using the exemplary values listed in TABLE II.

TABLE I

| Operating Parameter | Prior to t = 0 | After t = τ |
|---|---|---|
| IN | $V_{LOW}$ = VSWL-2$V_{BE}$ | $V_{HIGH}$ = VSWU-$V_{BE}$ |
| $\overline{IN}$ | $V_{HIGH}$ | $V_{LOW}$ |
| First Lower Limit Clamp 130 | Off | On |
| Second Lower Limit Clamp 140 | On | Off |
| Upper Limit Clamp 148 | On | On |
| First Timing Capacitor 126 | Charged | Drained |
| Second Timing Capacitor 136 | Drained | Charged |
| First Current Diverter 144 | Current Flow | No Current Flow |
| Second Current Diverter 146 | No Current Flow | Current Flow |
| Node 124 | $V_{MAX}$ = VSWU | $V_{MIN}$ = VSWL-$V_{BE}$ |
| Node 134 | $V_{MIN}$ | $V_{MAX}$ |
| $\overline{OUT}$ | $V_{HIGH}$ | $V_{LOW}$ |
| OUT | $V_{LOW}$ | $V_{HIGH}$ |

TABLE II

| Operating Parameter | Value |
| --- | --- |
| $V_{CC}$ | 3.00 V |
| VSWL | 2.50 V |
| VSWU | 2.25 V |
| $V_{MAX}$ | 2.25 V |
| $V_{MIN}$ | 1.75 V |
| $V_{HIGH}$ | 1.50 V |
| $V_{LOW}$ | 1.00 V |

TABLE III

| Operating Parameter | Prior to t = 0 | After t = τ |
| --- | --- | --- |
| IN | 1.00 V | 1.50 V |
| $\overline{\text{IN}}$ | 1.50 V | 1.00 V |
| First Clamped Node 124 | 2.25 V | 1.75 V |
| Second Clamped Node 134 | 1.75 V | 2.25 V |
| $\overline{\text{OUT}}$ | 1.50 V | 1.00 V |
| OUT | 1.00 V | 1.50 V |

The operation of the initial phase control circuit 10 will now be described with reference to the exemplary delay cell 100 using the exemplary values of the operating voltages listed in TABLES II and III.

During normal operation of the delay cell 100, the initial phase control circuit 10 does not affect the operation of the delay cell 100 and the first and second reset switches 22, 32 are in an off state while the set switch 24 is in an on state. With the first reset switch off or open in the first portion 20, the first reset switch 22, coupled to the second clamped node 134 of the delay cell 100, is open and thus the first portion 20 is not coupled to the delay cell 100. With the set switch 24 on or closed, the control current source 26 draws a current of amplitude I through the set switch 24. Further, with the second reset switch off or open in the second portion 30, the transistor 34 does not receive an input at its base node. Because the emitter node of the transistor 34 is coupled to the emitter nodes of both the first and second input receivers 122, 132, transistor 34 is reversed biased and is effectively an open circuit. Thus, the second portion 30 of the initial phase control circuit 10 is also not coupled to the delay cell 100. Because the initial phase control circuit 10 is not coupled to the delay circuit 100 through the first portion 20 or the second portion 30, the initial phase control circuit 10 does not affect or interfere with the operation of the delay cell 100 during normal operation of the delay cell 100.

During reset or non-oscillating operation mode of the delay cell 100, the normal oscillation operation of the delay cell 100 is stopped. To transition the delay cell 100 to reset mode, the first and second reset switches 22, 32 are switched to an on state while the set switch 24 is switched to an off state. With the second reset switch 32 in an on or closed state, the transistor 34 has both its collector and base node coupled to the power supply 12 such that transistor 34 functions as a diode to supply a current to the tail current source 118.

The voltage at the base node of transistor 34 is thus $V_{cc}$ less $V_{BE,\ 34}$. In the example given above with $V_{CC}$ and $V_{BE,\ 34}$ being approximately 3.0 V and 0.75 V, respectively, the voltage at the emitter nodes of transistor 34 is approximately 2.25 V. Because the emitter node of transistor 34 is coupled to the emitter nodes of the first and second input receivers 122, 132, the voltage at the base nodes of the first and second input receivers 122, 132 is also $V_{CC}$ less $V_{BE,\ 34}$ or 2.25 V. Further, because the inputs IN, $\overline{\text{IN}}$ to the base nodes of the input receivers 122, 132 are between 1.0 V and 1.5 V, the input receivers 122, 143 are reversed biased and are effectively open circuits. Thus, the tail current source 118 does not draw any current through either of the input receivers 122, 132 and draws a current of amplitude I through transistor 34.

With the set switch 24 in an off state and the first reset switch 22 in an on state, the first portion 20 of the initial phase control circuit 10 is coupled to the delay cell 100 at the second clamped node 134. The control current source 26 thus must draw a current of amplitude I through the second clamped node 134.

Specifically, the control current source 26 draws a current of amplitude I/2 through the second current source 138. The control current source 26 may also draw a current of amplitude I/2 through the second timing capacitor 136 and/or the second lower limit clamp 140, depending upon the voltage at the second clamped node 134. If the second clamped node 134 has a voltage of greater than VSWL less $V_{BE}$, or 1.75 V when the reset switches 22, 32 are turned on, then the second lower limit clamp 140 is off and the second timing capacitor 136 is charged to a certain extent. Once the reset switches 22, 32 are turned on, the control current source 26 pulls a current of amplitude I/2 through the second timing capacitor 136 until is it discharged to a voltage of $V_{MIN}$ or 1.75 V at the second clamped node 134. Once a voltage of $V_{MIN}$ is reached at the second clamped node 134, the second lower limit clamp 140 turns on to clamp the voltage at node 134 to $V_{MIN}$ of 1.75 V. With the second lower limit clamp 140 on, the control current source 26 no longer draws current through the second timing capacitor 136 and begins to draw a current of I/2 through the clamp 140.

With respect to the first branch 114 of the delay cell 100, because the first input receiver 122 is off, a current of amplitude I/2 supplied by the second current source 128 is diverted through current diverter 144 to the third branch 120. The upper limit clamp 148 remains on to supply another current of amplitude I/2 to the upper clamp current source 150. The upper limit clamp 148 also clamps the voltage at the first clamped node 124 to a voltage of $V_{MAX}$ or 2.25 V. Thus, the total current drawn by the upper clamp current source 150 is of amplitude I.

In addition, with the upper limit clamp 148 on, the emitter node of the upper limit clamp 148 is at a voltage of VSWU less $V_{BE}$ or 1.5 V and the voltage at the first clamped node 124 is VSWU or 2.25 V. The difference between the input voltage of VWSL or 2.50 V to the base node of the first lower limit clamp 130 and the voltage of 2.25 V at the first clamped node coupled to the emitter of the first lower limit clamp 130 is 0.25 V. Because the difference of 0.25 V is less than $V_{BE}$ of 0.75 V, the first lower limit clamp 130 is off. Also, with the voltage of 2.25 V at the first clamped node 124, the first timing capacitor 126 is charged.

TABLE IV summarizes the states and voltages of some of the operating parameters of the initial phase control circuit 10 and delay circuit 100 during reset and during normal operation of the delay circuit 100.

TABLE IV

| Operating Parameter | During Reset (Prior to t = 0) | Normal Operation (After t = τ) |
| --- | --- | --- |
| Reset Switches 22, 32 | On | Off |
| Set switch 4 | Off | On |

TABLE IV-continued

| Operating Parameter | During Reset (Prior to t = 0) | Normal Operation (After t = τ) |
|---|---|---|
| Current Source 26 | Draws current I through second branch 116 | Draws current I through set switch 24 |
| Transistor 34 | On; Supplies current of amplitude I to tail current source 118 | Off |
| Input Receivers 122, 132 | Off | On/Off |
| Upper Limit Clamp 148 | On | On |
| First Timing Capacitor 126 | Charged | Drained/Charged |
| Second Timing Capacitor 136 | Drained | Charged/Drained |
| First Current Diverter 144 | Current Flow | No Current/ Current Flow |
| Second Current Diverter 146 | No Current Flow | Current/No Current Flow |
| First Lower Limit Clamp 130 | Off | On/Off |
| Second Lower Limit Clamp 140 | On | Off/On |
| First Clamped Node 124 | 2.25 V | 1.75 V to 2.25 V |
| Second Clamped Node 134 | 1.75 V | 2.25 V to 1.75 V |
| Upper Limit Current Source 150 | Draws current of I/2 from the first branch 114 | Draws current of I/2 from second/first branch 116/114 |

As is evident, the initial phase control circuit 10 maintains the operating parameters of the delay cell 100 in a known state and merely temporarily redirects current from the delay cell 100. In other words, both the first and second clamped nodes remain clamped to known upper and limit voltages $V_{MAX}$ and $V_{MIN}$ just as they may be clamped during normal operation. By maintaining the operating parameters of the delay cell 100 in a known state, the performance of a PLL that utilize a delay circuit with the initial phase control circuit 10 is improved.

In the example described above with the initial phase control circuit 10 coupled to the second branch 116, the first clamped node 124 is clamped to a voltage of 2.25 V or $V_{MAX}$ by the upper limit clamp 148 having voltage VSWU as input to its base node and the second clamped node 134 is clamped to a voltage of 1.75 V or $V_{MIN}$ by the second lower limit clamp 140 having voltage VSWL as input to its base node. The first and second timing capacitors 126, 136 are also maintained such that one is charged and one is drained as may be the case during the normal operation. Moreover, the current diverted from the first or second branch 114, 116 to the third branch 120 is maintained at I/2 and the current through the third branch 120 is maintained at an amplitude of I. Although the first and second input receivers 122, 132 are off, the current through the first or second branch 114, 116 is diverted through the first portion 20 of the initial phase control circuit 10 and the current drawn by the tail current source 118 is supplied by the second portion 30 of the initial phase control circuit 10. The effect of the switches of the initial phase control circuit 10 is that the high frequency path through the first and second input receivers is disabled while reducing or minimizing any disturbance to the output signal.

As is evident, by maintaining the operating parameters such as the voltages at the first and second clamped nodes 124, 134, any possible abrupt changes in the current is reduced or minimized because current is merely diverted or rerouted and can be immediately routed back through the desired path upon application of appropriate inputs to the switches of the initial phase control circuit 10. In other words, no additional current is introduced into the delay cell 100 by the initial phase control circuit 10 such that upon restart, no or little readjustment of the current is necessary. Further, the charging states of the timing capacitors 126, 136, and the current through the first, second, and third branches 114, 116, 120 are at or near the values during normal operation of the delay cell 100. As such, the performance of a VCO utilizing the initial phase control circuit 10 should be improved. Namely, the time required to acquire lock by the VCO should be decreased not only due to control of the initial phase of the VCO but also due to the operating parameters already at or near the normal operating values.

Although a specific embodiment of a delay cell circuit is shown and described above, it is to be understood that the initial phase control circuit 10 may be utilized with any other suitable delay circuit and that the delay circuit 100 is but one example of a suitable delay circuit.

FIG. 3 shows a four-stage differential ring oscillator implementation of a VCO 300 implementing four initial phase start circuits. The four stage differential ring VCO 300 comprises four delay cells or stages 302, 304, 306, 308 and outputs VCOOUT 310. Preferably each of the four delay stages is identical in construction and produces the same delay. Each delay stage receives a first and second input and a first and second output. The first and second inputs of each delay stage are of same amplitude but opposite in phase and the outputs of each delay stage are similarly of same amplitude but opposite in phase. The first and second outputs of each of delay stages 302, 304, 306, are the first and second inputs of each of delay stages 304, 306, 308, respectively. The first and second outputs of the last delay stage 308 are fed back as the second and first inputs of the first delay stage 302. The first and second outputs of the last delay stage 308 are also the first and second outputs VCOOUT 310 of the four-stage differential ring VCO 300. Such differential feed back of the outputs of the last delay stage to the inputs of the first delay stage results in the frequency of the VCO output signal being 1/(2×number of delay stages×delay of each delay stage).

Each of the four delay stages 302, 304, 306, 308 is coupled to an initial phase start circuits 312, 314, 316, 318, respectively. Each initial phase start 312, 314, 316, 318 is coupled to initial phase control input 322, 324, 326, 328. Each initial phase control input comprises a first and second reset switch input and a set switch input. During normal operation, the reset switch inputs are set low and the set switch inputs are set high such that the reset switches are turned off and the set switches are turned on for all delay stages. A low switch input may be 0 V and a high switch input may be 3 V or $V_{CC}$, for example.

To stop or reset the VCO 300, one of the delay cells is stopped or reset. The particular delay cell is selected such that upon restart or resumption of normal operation of the VCO 300, the outputs VCOOUT 310 are at a desired phase. In other words, the accuracy of the initial phase control of the VCO may be adjusted by suspending and restarting a selected delay cell in the VCO ring. Although it is preferable that only one of the delay cells is stopped or reset, more than one of the delay cells may be stopped or reset. However, to restart the VCO, all of the delay cells must be set to resume normal oscillation of the VCO.

To stop or reset the selected delay cell, the corresponding reset switch inputs are set high and the corresponding set switch input is set low such that the reset switches are turned on and the set switch is turned off for the selected delay cell. The effect of such a reset mode or state is that the input to the selected delay cell is uncoupled from the remainder of the VCO circuit 300. The outputs VCOOUT 310 can thus be shifted in phase by the initial phase start circuits but the frequency of the outputs VCOOUT 310 remain the same.

FIG. 4 is a timing diagram of the inputs and outputs of each delay cell 302, 304, 306, 308 of the four-stage differential ring VCO 300, assuming the delay τ through each stage is approximately the same. If delay cell 304 is selected at time $t_1$ while the other delay cells 302, 306, 308 are unselected, the outputs of delay cell 302 are uncoupled from the inputs of the delay cell 304. Once delay cell 304 is selected at $t_1$, the outputs of the delay cells will continue to oscillate or change states for a period of just over 3τ after $t_1$ as the inputs $IN_{304}$, $\overline{IN}_{304}$ to delay cell 304 received by delay cell 304 prior to time $t_1$ continue to propagate through delay cells 304, 306, 308 and finally through delay cell 302. In particular, the outputs VCOOUT 310 will continue to oscillate for a period of just over 2τ after $t_1$. Further, because it is the outputs of the delay cell 302 that are uncoupled from the inputs to the delay cell 304, the outputs of delay cell 302 continue to propagate for a longest period of time of just over 3τ, after $t_1$ when compared to the other delay cells. After the signals have propagated through delay cell 302, the signals throughout all the delay cells remain the same until the selected delay cell 304 is unselected.

Once the delay cell 304 is unselected at time $t_2$, the outputs of delay cell 302 are again coupled to the inputs of the selected delay cell 304 and the signals propagate through delay cells 304, 306, 308 to the outputs VCOOUT 310. Thus, the outputs VCOOUT 310 will not change state until after the delay cell 304 is unselected at time $t_2$ and the $OUT_{302}$, $\overline{OUT}_{302}$ from delay cell 302 have propagated through delay cells 304, 306, 308, or for a period of three delays 3τ after time $t_2$. VCO clock is thus restored in a known phase.

While the preferred embodiments of the present invention are described and illustrated herein, it will be appreciated that they are merely illustrative and that modifications can be made to these embodiments without departing from the spirit of the invention. Thus, the invention is intended to be defined only in terms of the following claims.

What is claimed is:

1. An initial phase control for a delay cell, comprising:
    a current source circuit coupled to a first node of the delay cell;
    a current provider; and
    an initial phase controller including at least one switch coupled to said current source circuit and to said current provider to set an initial phase of the delay cell output such that the current source circuit and current provider are selectively and synchronously in an on or off state such that when the current source circuit and current provider are in an on state, the current source circuit draws a current through the first node of the delay cell and the current provider provides current through a second node of the delay cell and such that the phase of the delay cell output of the is started in a predetermined initial phase,
        wherein the initial phase controller includes a reset switch and a transistor, the reset switch is coupled between a power supply and the transistor, the transistor having collector, base, and emitter nodes coupled to said power supply, the reset switch, and the second node of the delay cell, respectively.

2. The initial phase of claim 1, wherein the transistors is a bipolar junction transistor.

3. An initial phase control for a delay cell, comprising:
    a current source circuit coupled to a first node of the delay cell;
    a current provider; and
    an initial phase controller including at least one switch coupled to said current source circuit and to said current provider to set an initial phase of the delay cell output such that the current source circuit and current provider are selectively and synchronously in an on or off state such that when the current source circuit and current provider are in an on state, the current source circuit draws a current through the first node of the delay cell and the current provider provides current through a second node of the delay cell and such that the phase of the delay cell output is started in a predetermined initial phase,
        wherein the initial phase controller includes a set switch, a first reset switch, and a current source coupled to ground, wherein the set switch is coupled between a power supply and the current source and the first reset switch is coupled between the first node and the current source.

4. The initial phase control of claim 3, wherein the initial phase controller includes a second reset switch and a transistor, the second reset switch is coupled between said power supply and the transistor, the transistor having collector, base, and emitter nodes coupled to said power supply, the second reset switch, and the second node of the delay cell, respectively.

5. The initial phase control of claim 3, wherein the set and reset inputs are of same amplitude and opposite in phase.

6. A method for controlling a delay cell, comprising:
    inputting a set input to a current source circuit;
    inputting a reset input to the current source circuit and a current provider, the set and reset input selectively and synchronously transition the current source circuit and the current provider between an on and off state such that when the current source circuit and current provider are in an on state, the current source circuit draws a current through a first node of the delay cell and the current provider provides current through a second node to the delay cell such that the phase of an output of the delay cell is started in a predetermined initial phase,
        wherein inputting the set input to the current source circuit includes inputting the set input to a set switch of the current source circuit, the set switch is coupled between a power supply and a current supply of the current source circuit.

7. A method for controlling a delay cell, comprising:
    inputting a set input to a current source circuit;
    inputting a reset input to the current source circuit and a current provider, the set and reset input selectively and synchronously transition the current source circuit and the current provider between an on and off state such that when the current source circuit and current provider are in an on state, the current source circuit draws a current through a first node of the delay cell and the current provider provides current through a second node to the delay cell such that the phase of an output of the delay cell is started in a predetermined initial phase,
        wherein inputting a reset input to the current source circuit includes inputting the reset input to a reset switch of the current source circuit, the reset switch is coupled between the current supply of the current source circuit and the first node of the delay cell.

8. A method for controlling a delay cell, comprising:

inputting a set input to a current source circuit;

inputting a reset input to the current source circuit and a current provider, the set and reset input selectively and synchronously transition the current source circuit and the current provider between an on and off state such that when the current source circuit and current provider are in an on state, the current source circuit draws a current through a first node of the delay cell and the current provider provides current through a second node to the delay cell such that the phase of an output of the delay cell is started in a predetermined initial phase, wherein inputting a reset input to the current provider includes inputting the reset input to a reset switch of the current provider, the reset switch is coupled between a power supply and a base node of a transistor of the current provider, a collector and emitter node of the transistor are coupled to the power supply and the second node of the delay cell, respectively.

9. A differential ring oscillator with initial phase control and having a plurality of delay cells in a ring configuration, comprising:

a first delay cell, one or more intermediate delay cells, and a last delay cell, wherein each delay cell is adapted to receive a first input and a second input and wherein each delay cell has a first output node and a second output node, wherein the delay cells are configured in a sequential ring configuration such that the first and second output nodes of the last delay cell are coupled to the second and first inputs of the first delay cell, respectively, and the first and second output nodes of each of the first and intermediate delay cells are coupled to the first and second inputs of a subsequent delay cell comprising the intermediate and the last delay cells, respectively; and at least one initial phase control circuit, each initial phase control circuit coupled to one of the delay cells, each initial phase control circuit comprising:

a current source circuit coupled to a first node of the delay cell to which the control circuit is coupled;

a current provider; and an initial phase controller including at least one switch coupled to said current source circuit and to said current provider to set an initial phase of said delay cell to which the control circuit is coupled such that the current source circuit and current provider are selectively and synchronously in an on or off state such that when the current source circuit and current provider are in an on state, the current source circuit draws a current through the first node of the delay cell to which the control circuit is coupled and the current provider provides current through a second node of the delay cell to which the control circuit is coupled, wherein the initial phase controller includes a reset switch and a transistor, the reset switch is coupled between a power supply and the transistor, the transistor having collector, base, and emitter nodes coupled to said power supply, the reset switch, and the second node of the delay cell to which the control circuit is coupled, respectively.

10. A differential ring oscillator with initial phase control and having a plurality of delay cells in a ring configuration, comprising:

a first delay cell, one or more intermediate delay cells, and a last delay cell, wherein each delay cell is adapted to receive a first input and a second input and wherein each delay cell has a first output node and a second output node, wherein the delay cells are configured in a sequential ring configuration such that the first and second output nodes of the last delay cell are coupled to the second and first inputs of the first delay cell, respectively, and the first and second output nodes of each of the first and intermediate delay cells are coupled to the first and second inputs of a subsequent delay cell comprising the intermediate and the last delay cells, respectively; and at least one initial phase control circuit, each initial phase control circuit coupled to one of the delay cells, each initial phase control circuit comprising:

a current source circuit coupled to a first node of the delay cell to which the control circuit is coupled;

a current provider; and an initial phase controller including at least one switch coupled to said current source circuit and to said current provider to set an initial phase of said delay cell to which the control circuit is coupled such that the current source circuit and current provider are selectively and synchronously in an on or off state such that when the current source circuit and current provider are in an on state, the current source circuit draws a current through the first node of the delay cell to which the control circuit is coupled and the current provider provides current through a second node of the delay cell to which the control circuit is coupled, wherein the initial phase controller includes a set switch, a first reset switch, and a current source coupled to ground, wherein the set switch is coupled between a power supply and the current source and the first reset switch is coupled between the first node of the delay cell to which the control circuit is coupled and the current source.

11. The differential ring oscillator of claim 10, wherein the initial phase controller includes a second reset switch and a transistor, the second reset switch is coupled between said power supply and the transistor, the transistor having collector, base, and emitter nodes coupled to said power supply, the second reset switch, and the second node of the delay cell to which the control circuit is coupled, respectively.

12. The differential ring oscillator of claim 10, wherein the set and reset inputs are of same amplitude and opposite in phase.

* * * * *